United States Patent [19]

Kuwabara

[11] 4,325,036

[45] Apr. 13, 1982

[54] TEMPERATURE COMPENSATING CIRCUIT

[75] Inventor: Tsuneo Kuwabara, Tokyo, Japan

[73] Assignee: Kabushiki Kaisha Daini Seikosha, Tokyo, Japan

[21] Appl. No.: 152,606

[22] Filed: May 23, 1980

[30] Foreign Application Priority Data

Jun. 1, 1979 [JP] Japan ................................ 54/068247

[51] Int. Cl.[3] ................................................ H03L 1/00

[52] U.S. Cl. ........................................ 331/176; 331/48; 331/162; 368/159; 368/202

[58] Field of Search .................... 331/176, 46, 48, 162; 368/202, 200, 159

[56] References Cited

U.S. PATENT DOCUMENTS

| | | | |
|---|---|---|---|
| 3,978,650 | 9/1976 | Hashimoto et al. | 331/176 X |
| 4,159,622 | 7/1979 | Akahane | 331/176 X |
| 4,272,840 | 6/1981 | Morozumi et al. | 331/176 X |

FOREIGN PATENT DOCUMENTS

| | | | |
|---|---|---|---|
| 54-154247 | 12/1979 | Japan | 331/176 |
| 55-42001 | 3/1980 | Japan | 368/202 |
| 55-47479 | 4/1980 | Japan | 331/176 |
| 55-112043 | 8/1980 | Japan | 331/176 |

*Primary Examiner*—Stanley T. Krawczewicz
*Attorney, Agent, or Firm*—Robert E. Burns; Emmanuel J. Lobato; Bruce L. Adams

[57] ABSTRACT

Temperature compensating circuit for an electronic timepiece having two piezo electric resonators having different frequency-temperature characteristics.

Two piezo electric resonators are a major resonator having smaller frequency variation rate in temperature variation and a subsidiary resonator having larger frequency variation rate in temperature variation.

And also the temperature compensating circuit includes a variable counter for counting the output signal of the major oscillator having the major resonator, a gate time setting circuit controlled by both the outputs of subsidiary and the variable counter, and a counter for counting the output signal of the major oscillator.

As a result, the temperature compensating circuit is able to improve the accuracy of the timepiece.

1 Claim, 11 Drawing Figures

TEMPERATURE COMPENSATING CIRCUIT

BACKGROUND OF INVENTION

The present invention relates to a temperature-compensating clock pulse generating circuit which generates temperature compensating clock pulses having a deviation of period within several tenth ppm. in a wide temperature range between, for instance, −50° C. and 100° C.

The temperature compensating circuit is effective especially for a timepiece. Recently, an accuracy of a timepiece has been improved since a quartz crystal has been brought into use for a resonator, and the allowable range of error to prove the accuracy of the timepiece has been expressed as a monthly error and further it has been shifted to be expressed as an annual error. However, the timepiece which displays the time accurately to this extent has not been realized by a single quartz crystal resonator which is generally used at present. Accordingly, a wrist watch which displays time accurately by employing two resonators has been put into a practical use by the following two methods. (These methods are illustrated in detail in 9-18 issues, 1978 and 2-19 issues, 1979 of the "Nikkei Electronics") One method is to use two quartz crystal resonators A and B (referred to resonator hereafter) having negative secondary temperature coefficients. The secondary temperature coefficients of the resonators A and B are the same, the peak temperature of the resonator A is higher than B, and frequency at the peak temperature of A is lower than B. The characteristics of the two resonators A and B are set in order that the temperature characteristic of the resonator B at the high temperature side coincides with the peak frequency of the resonator B at the peak temperature of A. And beats of the resonators A and B having the characteristics correlated as illustrated above are extracted to produce various temperature compensating pulses in an electronic circuit on the basis of the beats, and a constant period pulse against time is extracted by inserting the compensating pulse.

The other method is the conventional method in which two X-cut resonators having the same temperature characteristics and different peak temperatures are connected in parallel to act as one quartz crystal resonator equivalently.

Both the two methods have the disadvantages in common. Namely, it is difficult to set the characteristics of the resonators act as one couple, i.e., it is necessary to further select a couple of resonators of within a certain tolerance. Therefore, the resonators, which in the nature of things, could have been housed in one case, cannot but housed separately. Moreover, the temperature range to be compensated, using a couple of resonators, is no more than around between 0° and 50°, and this temperature compensating range is insufficient to assure the accuracy of the timepiece to the extent of the annual error of the time display under any areas and any circumstances.

BRIEF SUMMARY OF INVENTION

Accordingly, it is an object of the present invention to eliminate the above illustrated major disadvantages and to provide a temperature compensating circuit which can utilize not only the resonators having strictly limited feature but also the resonators having the other characteristics.

Other and further objects, features and advantages of the invention will appear more fully from the following description.

DETAILED DESCRIPTION OF THE INVENTION

Figure 1:
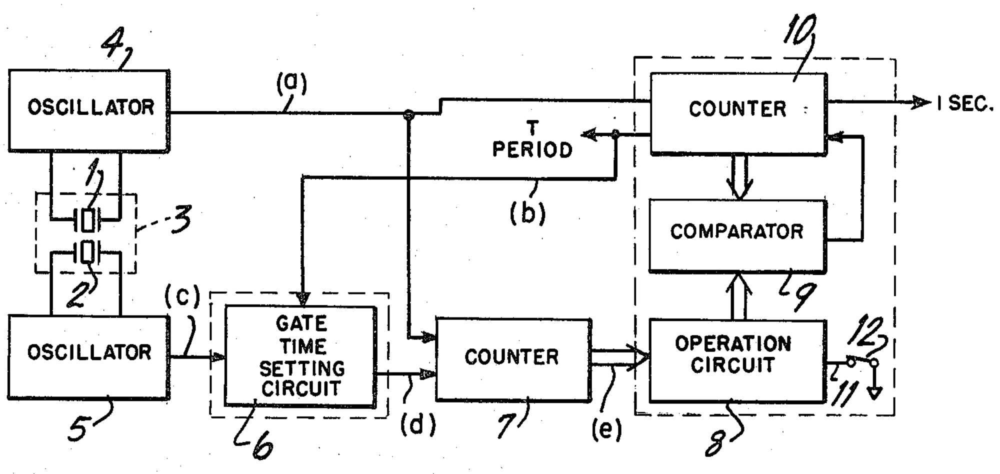
FIG. 1 is a fundamental circuit block according to the present invention.

Referring first to FIG. 1, there is shown a fundamental circuit block which achieves the object of the present invention, in which resonators 1 and 2 are housed in the same case 3 in order to improve a thermal coupling. The resonator 1 is a major resonator and the resonator 2 is a subsidiary resonator. Both the resonators 1 and 2 have the negative secondary temperature coefficients. The temperature coefficient of the resonator 2 is larger than the resonator 1, the peak temperature of the resonator 2 is lower than the room temperature and the frequency of the resonator 2 at the peak temperature is higher than that of the resonator 1. The peak temperature of the resonator 1 is near the room temperature. The X-cut resonator of 32 KHz is sufficient for the resonator 1. It is possible for the X-cut resonator presently disclosed and the other resonators to change the characteristics in accordance with the course as illustrated above, i.e., to increase the temperature coefficients and to reduce the peak temperatures. But it is very difficult to change the characteristics reversely, i.e., to decrease the temperature coefficients and to raise the peak temperature. Oscillators 4 and 5 respectively oscillate the resonator 1 and the resonator 2. The output from the resonator 2 is fed to a gate time setting circuit 6, and the output from the resonator 1 is counted by a counter 7 at a gate time produced by the gate time setting circuit 6, and the counting value is N. The gate time set by the gate time setting circuit 6 is a time necessary to count k pieces of output pulses of the resonator 2. The concrete circuit structure of the gate time setting circuit will be illustrated later.

Now the significance of the counting value N with respect to temperature will be illustrated. Arbitrary temperature of the resonators 1 and 2 is T, oscillating frequencies at the arbitrary temperature are respectively $f_1T$ and $f_2T$, peak temperatures are respectively $T_1$ and $T_2$, secondary temperature coefficients $\beta_1$ and $\beta_2$, and tertiary temperature coefficients are $\alpha_1$ and $\alpha_2$ in FIG. 1. If the gate time obtained by the gate time setting circuit 6 is the time taken to count K pieces of the outputs from the resonator 2, the counting value N is represented by the following formula.

$$N = kf_1T/f_2T$$
$$= kf_1\{1 + \beta_1(T - T_1)^2 + \gamma_1(T - T_1)^3\}/[f_2\{1 + \beta_2(T - T_2)^2 + \gamma_1(T - T_2)^3\}] \quad (1)$$

Namely N is a function with respect to the characteristics of the resonators 1 and 2 and the temperature T. The formula (1) is further developed to $kf_1T - Nf_2T = 0$ . . . (2). And if an equation is set up with respect to T, $AT^3 + BT^2 + CT + D = 0$ . . . (3), where $A = kf_1\alpha_1 - Nf_2\alpha_2$, $B = kf_1(\beta_1 - 3\alpha_1T_1) - Nf_2(\beta_2 - 3\alpha_2T_2)$, $C = kf_1(3\alpha_1T_1^2 - 2\beta_1T_1) - Nf_2(3\alpha_2T_2^2 - 2\beta_2T_2)$ and $D = kf_1(\beta_1T_1^2 - \alpha_1T_1^3 + 1) - Nf_2(\beta_2T_2^2 - \alpha_2T_2^3 + 1)$. The values of A to D inclusive are determined by measuring the counting value N since the value varied according to the temperature T is only N. Therefore the value of T is found by expanding the equation (3), and $f_1T$ is determined by substituting the value of T for $f_1T = f_1\{1 + \beta_1(T - T_1)^2 + \alpha_1(T - T_1)^3\}$. . . (4). Though $f_1T$ at an arbitrary temperature T is determined by adopting the regular method there is a problem for operating the root of a cubic equation T by an IC within a watch body since the area of IC enlarges and the power consumption increases. Therefore the method to find $f_1T$ from the counting value N without finding the temperature T will be illustrated later. But the description will be continued on the assumption that $f_1T$ have been found, temporarily. $f_1T$ is found by an operation circuit 8 by the method mentioned later, and the value $f_1T$ is maintained for a fixed period as the counting output. A counter 10 keeps counting receiving the oscillating frequency $f_1T$ of the resonator 1 as an output. The oscillating frequency $f_1T$ varies subjected to the temperature variation. The counted output connected by the counter 10 is compared with the counted output from the operation circuit 8 digitally by a comparator 9 for a fixed period of time. The comparator 9 produces the output to reset the counter 10 when both the counted outputs coincide. The reset counter 10 counts the oscillating output $f_1T$ of the resonator 1 newly and repeats the same operation hereafter. Temperature of the output period T of the counter 10 synchronized with the reset signal produced from the comparator 9 is compensated and becomes a fixed period against time.

The principal mentioned above can be summarized as follows. The one output period of the counter is always fixed regardless of temperature by counting the number of pulses per a unit time varied by temperature because the capacity of the counter is changed corresponding to the temperature.

Figure 2:
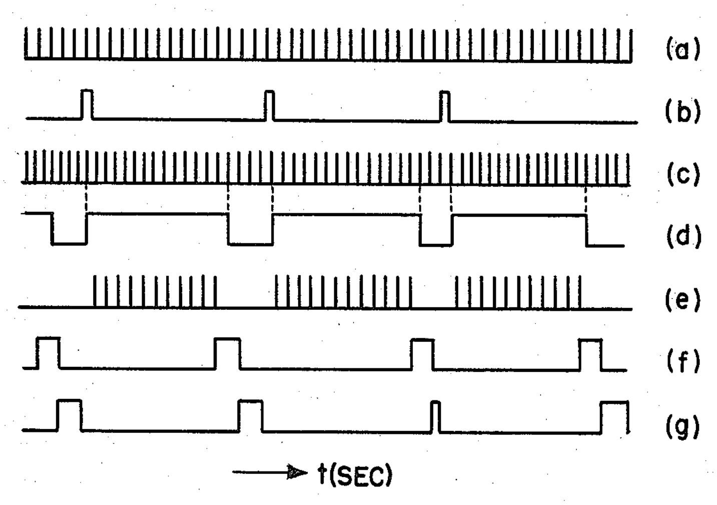
FIG. 2 is a time chart of the major signals in FIG. 1.

Subsequently the time relation of each major signal in FIG. 1 will be illustrated by the time chart in FIG. 2. Each signal (a) to (e) inclusive in the time chart in FIG. 2 is the signal corresponding to (a) to (e) inclusive in FIG. 1, but (f) and (g) are not shown in FIG. 1. FIG. 2 shows each signal under the normal condition of the circuits in FIG. 1, and the circuit operation at start will be illustrated later. Duty cycles of pulses of each signal (a), (c), and (e) in FIG. 2 are drawn correctly for convenience of the drawing. The signals (a) and (c) in FIG. 2 are the outputs (a) and (c) of a couple of resonators in FIG. 1, both of which vary momentarily subjected to the temperature variation. The signal (b) in FIG. 2 is a period T(b) of the counter 10 in FIG. 1, the temperature of which is compensated, obtained by the method mentioned before. The signal (d) in FIG. 2 is the gate time (d) made in the gate time setting circuit 6 in FIG. 1, which is obtained by the following method.

The signal (c) in FIG. 2 is started counting just after the temperature-compensated period T(b) produced from the counter 10 in FIG. 1, and the time corresponding to k pulses of the predetermined signal (c) is the gate time (d). A counting value N(e) in FIG. 2 is obtained by counting the signal (a) by the counter 7 in FIG. 1 during the gate time (d). The counting value N(e) is transmitted to the operation circuit 8 by the required number of bits, and the time taken to operate the required content by the operation circuit 8 is shown by the positive pulse width of the signal (f) in FIG. 2. The positive pulse width of the signal (g) in FIG. 2 indicates a wait time from the time the operation of the operation circuit 8 is over and the counting value is produced by the necessary number of bits until the counting value coincides with the counting value of the counter 10.

Take note that it is not necessary to produce the counting value of the operation circuit 8 constantly during the time interval between the previous coincidence of the counting value of the counter 10 in FIG. 1 and the counting value of the operation circuit 8 and the next coincidence thereof. That is to say, the frequency variation range of the resonator 1 in FIG. 1 is no more than several ppm order. Therefore, if the frequency is calculated on trial when the secondary temperature coefficient is $-4 \times 10^{-8}/°C.$ estimating highly, (the tertiary temperature coefficient is ignored since it scarcely effects on the frequency), the peak temperature is 25° C. and the frequency at the peak temperature is 32768 Hz, the frequency varying in the range between −50° and 100° C. is in the range between 32761 Hz and 32768 Hz raising to an integer not lower than the decimal point, i.e., the former four figures 3276 are fixed in the above mentioned temperature range. The time taken to count 32768 pulses and the time taken to count 8 pulses are in the ratio 4096:1, the other words, in the ratio 1:0.00024. If it takes one second to count 32768 pulses. 0.3 msec is enough to count 8 pulses. The counting value of the operation circuit 8 and the counting value of the counter 10 coincide in the time interval of 0.3 msec, and the counting output of the operation circuit 8 in FIG. 1 is unnecessary during the former 0.9997 msec.

By the reasons illustrated so far, the short time interval as the signal (g) in FIG. 2 is enough for the counting output of the operation circuit 8 in FIG. 1.

Figure 3:
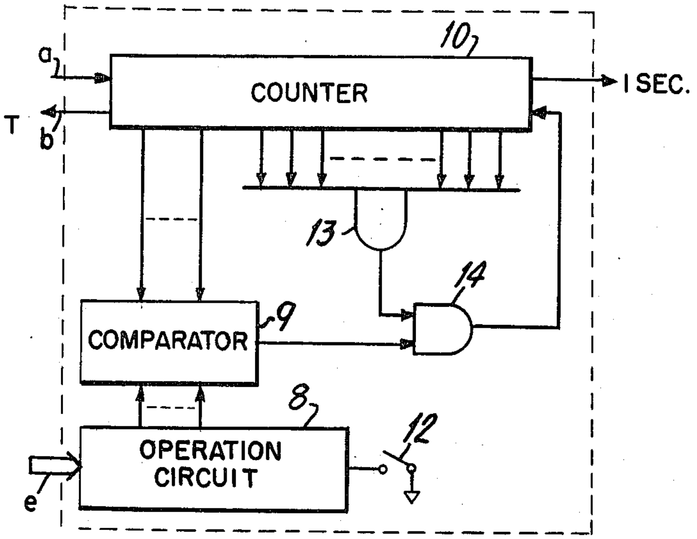
FIG. 3 is an embodiment of the operation circuit, the comparator and the counter.

FIG. 3 shows an embodiment of the operation circuit 8, the comparator 9 and the counter 10 surrounded by dotted line in FIG. 1 more concretely, where the numerals corresponding to the numerals in FIG. 1 denote the same portions. AND circuits 13 and 14 are newly added. However, the digital pulse compensating method accompanies error of quantigation represented by 1/f when the frequency is f. If the oscillation frequency of the resonator 1 in FIG. 1 is f=32768 Hz, the resolution is no more than 30 ppm per one pulse. Therefore, in order to satisfy the conditions for practical use, if the temprature is compensated by 256 f, i.e., 8388608 pulses, the resolusion of 0.12 ppm per one pulse is obtained. Namely, if the oscillating frequency of the resonator 1 in FIG. 1 is f=32768 Hz and compared once 256 seconds, the number of pulses vary in 256 seconds as described above are between 8386816 and 8388608, i.e., the number of the fixed pulses are 8388608 and the variable pulses are 1792. If the pulses are converted into bits, the signals corresponding to eight bits vary and the remaining signals corresponding to fifteen bits can be fixed. If this condition is applied to the circuits in FIG. 3, the variable signals corresponding to eight bits are transmitted from the counter 10 to the comparator 9 as shown by the arrows and the fixed signals corresponding to fifteen bits are transmitted from the counter 10 to the AND circuit 13 as shown by the arrows.

All the inputs fed to AND circuit 13 are the positive logic "1" from the nature of things when the fifteen bits signals fed to AND circuit 13 are the fixed value. It is not until the output from the AND circuit 13 is produced that AND condition is set by the output signal from the comparator 9 and AND circuit 14, and the counter 10 is reset by the output from the AND circuit 14 as shown. In this case the counting output of the operation circuit 8 is, of course, not more than eight bits.

While the compensating method of the outputs from the resonator 1 in FIG. 1 is selected according to the object. Namely, the output is compensated each one second period or each n seconds period collectively.

If the method to compensate the output each n second period collectively is selected, the wavelength of the one second outputs of the counter 10 slightly deviate from one second up to (n−1)th pulses influenced by temperature, and the error deviation up to (n−1)th pulses influenced by temperature is compensated collectively at n-th pulse. This method to compensate the output from the resonator 1 n pieces collectively is effective enough since the timepiece is a time integrating instrument.

Subsequently the embodiment of the method to obtain the gate time by the gate time setting circuit 6 in FIG. 1 conceretely and the method to obtain the gate time (d) from the start condition that the period T(b) does not exist in FIG. 2, will be illustrated in conjunction with FIGS. 4 and 5.

Figure 4:
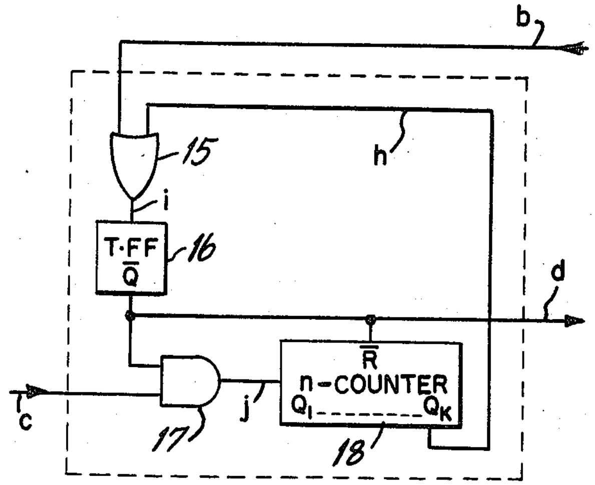
FIG. 4 is an embodiment of the gate time setting circuit in FIG. 1.

The circuits surrounded by a dotted line in FIG. 4 is an embodiment of the gate time setting circuit 6 in FIG. 1, and symbols (a) to (j) inclusive representing each signal correspond to the symbols in FIG. 1 to FIG. 5 inclusive. The gate time setting circuit 6 comprises OR circuit 15, a trigger flipflop 16 (hereinafter referred to T.FF), AND circuit 17 and n-counter 18 and connection of each signal is as shown in FIG. 4.

Figure 5:
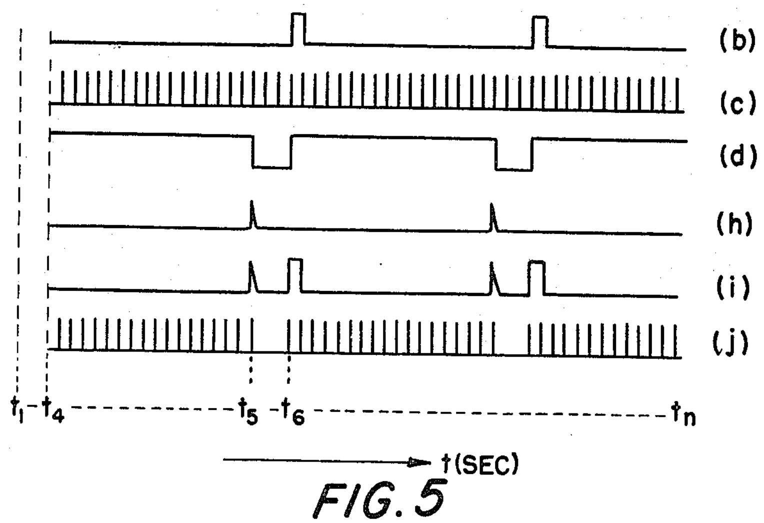
FIG. 5 shows time charts of FIG. 4.

FIG. 5 shows time charts of each signal (b), (c), (d), (h), (i) and (j) inclusive in FIG. 4. T.FF 16, n-counter 18 in FIG. 4 and all sequential circuits in FIG. 1 are automatically reset for an instant after the power source is applied in order to zero the primary value. And the n-counter 18 is reset by the signal at a low level, and conditions of T.FF 16 and the n-counter 18 change at the positive going waveform. If the power source is applied at $t_1$ in FIG. 4 and FIG. 5, the power source is automatically reset at $t_2$. In this condition only $\bar{Q}$ signal (d) of T.FF 16 is at a high level and the other signals are at a low level (hereafter a high level and a low level are respectively referred to H and L). The reset condition is removed at $t_3$ and the resonator output (c) in FIG. 1 is fed at $t_4$. (Since $t_1$ to $t_4$ inclusive are the operation at start for an instant, the waveforms in FIG. 5 do not correspond to each signal and the waveforms after $t_4$ correspond to each signal). When the signal (c) is fed to n-counter 18 by way of AND 17, Qk output (h) of n-counter 18 becomes H, an output (i) of OR circuit 15 becomes H, $\bar{Q}$-output (d) of T.FF 16 becomes L and an output (j) of AND circuit becomes L by the k-th signal (c) at $t_5$, and when n-counter 18 is reset, Qk output (h) and OR circuit output (i) abruptly become L and the wedge pulses are produced.

Thereafter the circuit condition of FIG. 4 cannot be changed except by the period T(b). The (j) output is generated by the signal of period T(b) produced by the counter 7, the operation circuit 8, the comparator 9 and the counter 10 after $t_5$ as illustrated in FIG. 1. The signal of period T(b) is fed to an input of OR circuit 15 at $t_6$ and transmitted to the output (i) of OR 15 as it is and reverses the output $\bar{Q}$ (d) of T.FF 16 and removes a reset of n-counter 18 in FIG. 4, at the same time, the output (c) of the resonator in FIG. 1 is produced as the output (j) of AND circuit 17, and n-counter 18 turns the output (h) of Qk to H at k-th of the signal output (c). Thereafter the same operation is repeated.

The time charts in FIG. 5 shows the operation of the gate time setting circuit 6 in FIG. 4. The gate time obtained by the gate time setting circuit in FIG. 4 is the signal (d) in FIG. 5. The gate time is not constant and varies according to temperature. As illustrated above, the gate time setting circuit operates smoothly from start condition.

Subsequently the aforementioned "predetermined k pulses" will be illustrated. The predetermined k pulses corresponds to k in case n-counter 19 in FIG. 4 is changed to k-counter, and k is the number of the signal (j) in FIG. 5 between $t_4$ and $t_5$. It means that the interval between $t_4$ and $t_5$ is the time for sampling the temperature and in order to elongate the time interval, it is necessary to enlarge k. The more k enlarges, the more the number of the signal (j) increases as well as the more the counting value N increases. By an increase in a counting value N, the temperature resolution goes up. The upper limitation of k is determined by the conditions that the interval between $t_5$ and $t_6$ should be included in the interval between $t_4$ and $t_6$ of the signal (j). The other words, the operation period of the operation circuit 8 in FIG. 1 and the wait period of the signal (g) in FIG. 2 should be included in the interval between $t_4$ and $t_6$ of the signal (j). Therefore k corresponding to the remaining time will be selected after the maximum variation range of the signals (f) and (g) in FIG. 2 are decided. Then the method to obtain $f_1T$ from the counting value N will be illustrated.

Figure 6:
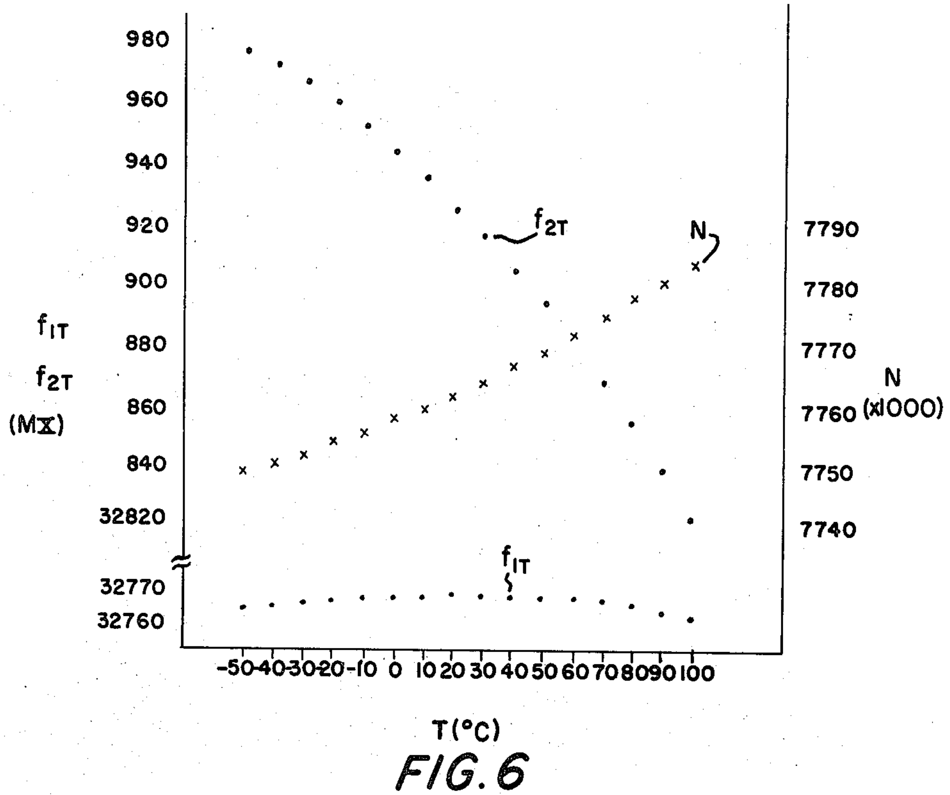
FIG. 6 is a characteristic diagram of TvsN, $f_1T$ and $f_2T$.
Figure 7:
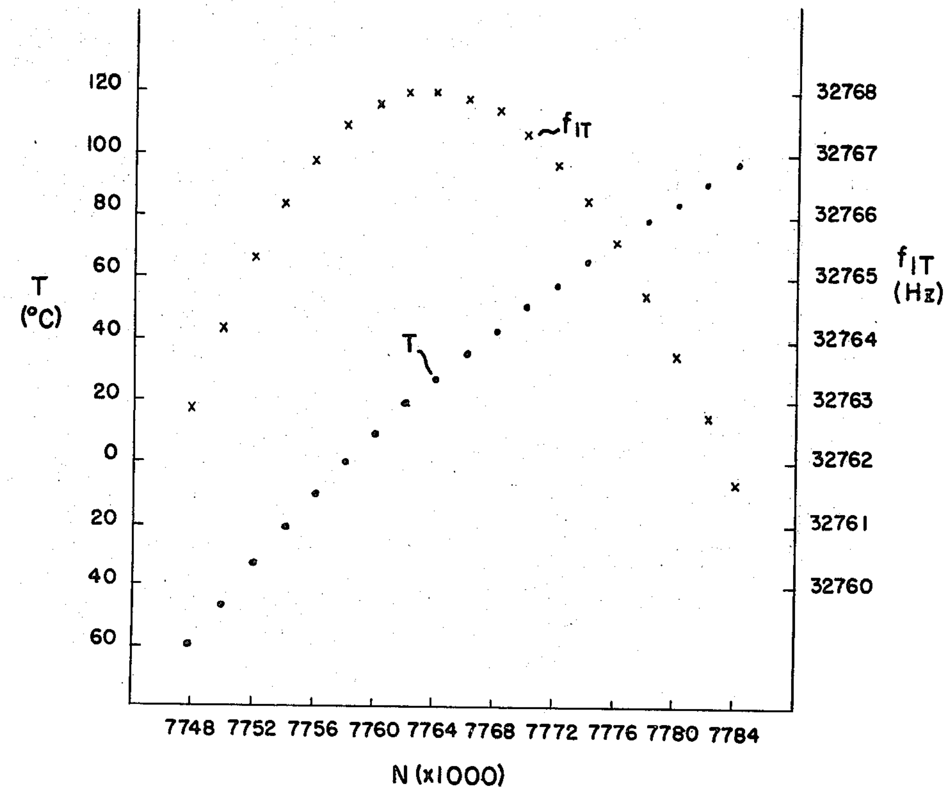
FIG. 7 is a characteristic diagram of NvsT and $f_1T$.

FIG. 6 is a characteristic diagram showing the relation between $f_1$, $f_2$, N and T in case $f_1=32768$ (Hz), $\beta_1=3\times10^{-8}(°C.^2)^{-1}$, $\alpha_1=-1\times10^{-10}(°C.^3)^{-1}$, $T_1=25(°C.)$, $f_2=33000$ (Hz), $\beta_2=-6\times10^{-8}(°C.^2)^{-1}$, $\alpha_2=-1\times10^{-10}(°C.^3)^{-1}$ and $k=7800000$. FIG. 7 is a characteristic diagram showing the relation between $f_1T$, T and N revising the relation of FIG. 6. The relation of $f_1T=F(N)$ is approximated by developing the formula of Taylor's series. Although the degree of the term to be developed is determined by the requird precision, it is sufficient to develop the formula to the third degree practically. If $f_1T=F(N)$ is approximated to the third degree of the term, $f_1T=AN^3+BN^2+CN+D$. Four absolute terms from A to D inclusive are obtained by measuring the values of N and $f_1T$ by the counter at four arbitrary temperatures.

If the values N and $f_1T$ at the four arbitrary temperatures Ta, Tb, Tc and Td are respectively Na, Nb, Nc, Nd, $f_1Ta$, $f_1Tb$, $f_1Tc$ and $f_1Td$, the following biquadratic simultaneous equations of four elements are respresented.

$$f_1Ta = N^3aA + N^2aB + NaC + D$$

$$f_1Tb = N^3bA + N^2bB + NbC + D$$

$$f_1Tc = N^3cA + N^2cB + NcC + D$$

$$f_1Td = N^3dA + N^2dB + NdC + D$$

And by developing the following 4 lines and 4 rows, A, B, C and D are obtained.

$$\begin{bmatrix} A \\ B \\ C \\ D \end{bmatrix} = \begin{bmatrix} Na^3 & Na^2 & Na^2 & 1 \\ Nb^3 & Nb^2 & Nb^2 & 1 \\ Nc^3 & Nc^2 & Nc^2 & 1 \\ Nd^3 & Nd^2 & Nd^2 & 1 \end{bmatrix}^{-1} \begin{bmatrix} f_1Ta \\ f_1Tb \\ f_1Tc \\ f_1Td \end{bmatrix}$$

If A, B, C and D are determined, $f_1T$ is determined by $f_1T = AN^3 + BN^2 + CN + D$. In order to raise the precision of $f_1T$ more, it is effective to apply the minimum binary system by multiplying the measuring points. The precision at the arbitrary temperature is not necessary for this measuring method but it is sufficient to fix the arbitrary temperature, and $f_1T$ of high precision is realized since the measuring value is N and the frequency is $f_1T$. To tell more concretely, if $f_1T$ is approximated by a cubic equation, $f_1T$ is obtained by $f_1T = AN^3 + BN^2 + CN + D$.

Figure 8:
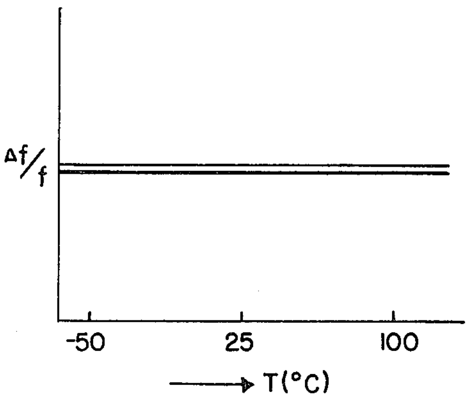
FIG. 8 is a frequency-temperature characteristic obtained by the present method.

FIG. 8 is a frequency-temperature characteristic diagram showing substantially a fixed temperature characteristics in a wide range obtained by the temperature compensating circuit applying the principle of the present method.

Figure 9:
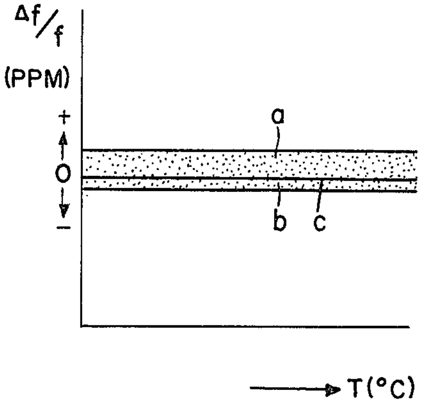
FIG. 9 is a diagram showing the relation between the fundamental frequency and the temperature characteristic in case the fraction of figures are cut off.
Figure 10:
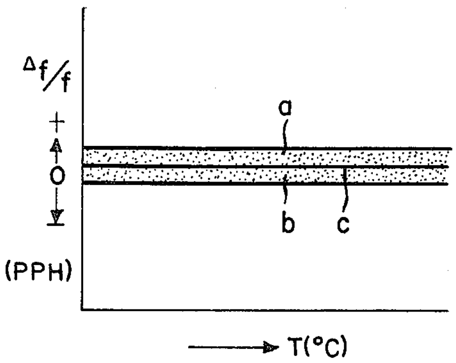
FIG. 10 is a diagram showing the relation between the fundamental frequency of the temperature characteristic in case the fraction of figures are rounded to the nearest whole number.

Lastly the relation of the frequency tuning will be illustrated. The counting outputs of the operation circuit 8 in FIG. 1 should be integers and fractions should be omitted, raised to a unit or rounded to the nearest whole number. FIGS. 9 and 10 are the correlation diagrams between the fundamental frequency and the temperature characteristics in which fractions are treated differently, where the abscissa shows the ambient temperature, the ordinate shows the amount of deviation from the reference frequency indicated by ppm, c represents a reference frequency, a represents the amount of plus deviation from the reference frequency, b represents the amount of minus deviation from the reference frequency. Both a and b have certain widths in order to show the range of quantigation error. FIG. 9 shows the deviation of the temperature characteristics in case fractions are omitted, in which the amount of plus deviation is larger than the amount of minus deviation. The rate of the plus deviation and the minus deviation is reversed in case fractions are raised to a unit (not shown). FIG. 10 shows the deviation of the temperature characteristic in case fractions are rounded to the nearest whole number. This figure is preferable since the amount of plus deviation and the amount of minus deviation is substantially the same. Then terminals 11 and 12 attached to the operation circuit 8 in FIG. 10 will be illustrated.

Figure 11:
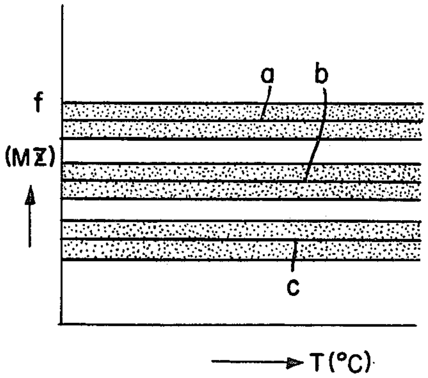
FIG. 11 is a diagram showing the frequency variation by varying the counting value of the fundamental frequency.

As illustrated before, though $f_1T$ is obtained by $f_1T = AN^3 + BN^2 + CN + D$, the $f_1T$ value may be varied by constructing the circuit so that the D value may change arbitrary by switch operation of the terminals 11 and 12. If the D value enlarges, the reference frequencies of FIG. 11 are changed from a to b and b to c, and the frequency can be adjusted.

As illustrated in detail hereinbefore, by applying the present method, the following advantages are obtained in comparison with the conventional method:

1. The temperature compensating range is wider than the conventional method.

2. Since the degree of the freedom of the characteristics of the two quartz resonator is high, the tuning of the characteristics as a couple is unnecessary, as a result the productivity becomes high.

3. Since all the signals are representated digitally, this method is suitable for applying to an IC.

4. This method can be adopted to various resonators.

Although the embodiments of the present invention applied to the X-cut resonator have been illustrated, it is possible to apply to the other resonator having different characteristics.

What is claimed is:

1. A temperature compensating circuit comprising: two piezo electric resonators having different frequency-temperature characteristics, a major resonator having smaller frequency variation rate in temperature variation and a subsidiary resonator having larger frequency variation rate in temperature variation; an oscillator for oscillating said two resonators independently; a gate time setting circuit for setting a gate time using one of outputs of said oscillator; a counter for counting the other output of the oscillator by a gate time set by the gate time setting circuit; an operation circuit for operating an oscillation frequency of the resonator using coefficients of each term of high degree polynominal approximately concluded when a counting value is a variable against an oscillating frequency of the major resonator; a counter for counting the oscillator output of the major resonator; and a comparator for comparing the counting value of the counter with the counting value of the operation circuit and for generating a reset signal when the counting values coincide with each other.

* * * * *